United States Patent [19]

Inoue et al.

[11] 4,252,879
[45] Feb. 24, 1981

[54] IMAGE RECORDING MATERIAL HAVING OPTICALLY DIFFERENT PARTICLES

[75] Inventors: Eiichi Inoue; Masanori Akada, both of Tokyo, Japan

[73] Assignee: Dai Nippon Insatsu Kabushiki Kaisha, Tokyo, Japan

[21] Appl. No.: 63,163

[22] Filed: Aug. 3, 1979

[30] Foreign Application Priority Data

Aug. 8, 1978 [JP] Japan .................... 53/96389

[51] Int. Cl.³ .................................... G03C 1/76
[52] U.S. Cl. ........................ 430/9; 101/454; 101/457; 101/455; 430/11; 430/17; 430/162; 430/165; 430/167; 430/273; 430/290; 430/523; 430/950
[58] Field of Search ............. 430/950, 523, 290, 273, 430/162, 165, 167, 9, 11, 17; 101/454, 457

[56] References Cited

U.S. PATENT DOCUMENTS

| | | | |
|---|---|---|---|
| 3,111,407 | 11/1963 | Lindquist et al. | 430/162 |
| 3,411,907 | 11/1968 | Whitmere et al. | 430/950 |
| 3,687,703 | 8/1972 | Osashi et al. | 430/950 |
| 3,996,056 | 12/1976 | Muller | 430/165 |
| 4,126,460 | 11/1978 | Okishi | 430/950 |
| 4,168,979 | 9/1979 | Okishi et al. | 430/950 |

*Primary Examiner*—Jack P. Brammer
*Attorney, Agent, or Firm*—Koda & Androlia

[57] ABSTRACT

An image recording material formed with a support, a photosensitive composition layer formed on the support, and a mono-particle layer of solid particles of different optical transmittances formed on the photosensitive composition layer. When the recording material is exposed to light, the firmness with which the photosensitive composition holds the solid particles varies locally from point to point in accordance with the exposure energies of light passed through the solid particles. Thus by causing the dissolving force of the solvent or other physical forces to act on the photosensitive composition, the particles held weakly are selectively removed from the recording material, whereby an image is formed by the particles left on the recording material. The recording material on which the image has been formed can be used as a printing form as it is or by being subjected to simple after-treatment.

11 Claims, 6 Drawing Figures

IMAGE RECORDING MATERIAL HAVING OPTICALLY DIFFERENT PARTICLES

BACKGROUND OF THE INVENTION

This invention relates to novel image recording materials, and more particularly to a novel image recording material on which a continuous tone original is contact-printed or projection-printed so that an image with gradation is obtained through development or simple after-treatment.

Silver-salt photosensitive materials to record toned or gradational images are known in the art. Furthermore, gradational images can be recorded with non-silver-salt photosensitive materials such as free radical photosensitive materials, photochromic photosensitive materials, heat-sensitive materials, and diazo photosensitive materials.

The mechanism of recording gradational images by using the above-described photosensitive materials will be briefly described. The material of the photosensitive layer reacts in accordance with the exposure energy, and differences between the quantities of substances produced by the reaction are converted into differences in optical density to record a gradational image. Alternatively, after-treatment is effected with substances produced by exposure as nuclei of development, as a result of which substances causing optical density differences are produced to record a gradational image.

The above-described photosensitive materials can satisfactorily record continuous tone images. However, unlike the image recording material of the invention, they cannot be used as printing forms, that is, the images of originals recorded thereon cannot be used as printing forms. Besides the methods of using the above-described photosensitive materials, the following methods are employed in the fields of printing and makeup to provide gradational images.

(1) A method in which a contact screen is used.

A continuous tone original is printed on a lith type film or the like through a halftone film called "a contact screen", so that a continuous tone image based on the optical density differences of an original is converted into minute dots and tone reproduction is effected by utilizing the differences in size of the dots.

If the image formed by the dots is printed on a PS plate, then a printing form can be obtained. In multicolor printing, the colors of an original are separated into yellow, magenta, cyan and black, and printing forms are prepared respectively for these colors in the above-described method. The images of the original different in color are printed repeatedly on one and the same sheet to provide a colored image. In this case, a problem arises in that a moiré pattern due to the regular mesh of the contact screen appears. Furthermore, the method suffers from an operational difficulty accompanying the use of the contact screen.

(2) A method in which a screenless lithography is used.

A film of diazonium salt photosensitive material is formed on a grained aluminum plate, and the film thus formed is exposed to light, only through a continuous tone original, thereby to provide a lithographic printing plate. This method may be practiced in two ways depending on the kinds of diazonium salts. In one method, positive-to-positive conversion is carried out, and in the other method, negative-to-positive conversion is carried out. There are two kinds of diazonium salts usable in the method. In one of the two kinds of diazonium salts, the hydrophobic characteristic thereof is changed to the hydrophilic characteristic by optical decomposition, and in the other the hydrophilic characteristic is changed to the hydrophobic characteristic. The former is used for the positive-to-positive conversion type screenless lithography, and the latter is used for the negative-to-positive conversion type screenless lithography. The decomposition reaction of the diazonium salt coated on the aluminum plate is advanced to a depth corresponding to the quantity of exposure. When a positive type diazonium salt is used, planar regions of the coated film wherein the entire thickness has not been changed from the hydrophobic characteristic to the hydrophilic characteristic, remain on the aluminum plate even after development by water washing, thereby to effect the positive-to-positive image conversion. On the other hand, when a negative type diazonium salt is used, planar regions of the coated film wherein the entire thickness has not been changed from the hydrophilic characteristic to the hydrophobic characteristic are removed from the aluminum plate through development by water washing.

The mechanism of obtaining a gradational printing form from a continuous tone original according to the method will be briefly described with reference to the positive-to-positive conversion type screenless lithography. The thickness of the film of diazonium salt coated on a grained aluminum plate is variable in correspondence to the grained surface of the aluminum plate. In the regions of the diazonium salt film subjected to a relatively large exposure energy depending on the tone of the original, the diazonium salt is decomposed to the bottom of the grain. Accordingly, a hydrophilic aluminum surface appears upon development, and this surface repels ink in printing. If, in contrast, the exposure energy is less, then the decomposition is less, as a result of which a lipophilic diazonium salt is left on the aluminum plate, and the lipophilic diazonium salt thus left attracts ink in printing. In the regions of the diazonium salt film where the exposure energy is between those in the two cases described above, the decomposition is caused to half of the depth of the grain, and accordingly the ink adhering area is between those in the two cases described above.

Thus, the ink adhering area is varied in accordance with the configuration of the grains formed on the surface of the aluminum plate and also the exposure energy, and therefore the tone of the original is reproduced.

The method is advantageous in that it is unnecessary to use a contact screen. However, it is still not fully satisfactory in that it is difficult to provide a printing form stable in quality because the tone reproduction of printed images is changed by delicate variations in quantity of coating diazonium salt and by variations in configuration of grains.

(3) A method in which collotype printing is employed.

In this method, a continuous tone image is printed by utilizing the optical curing of a dichromate gelatin film formed on a glass plate.

The mechanism will be briefly described. The gelatin in the regions of the dichromate gelatin film subjected to a relatively large exposure energy, is cured. That is, the gelatin no longer absorbs cold water but readily attracts fatty ink. In contrast, the gelatin in the regions of the film which has not been exposed to light absorbs cold water well but does not attract fatty ink. The gelatin in the regions of the film where the exposure energy is between those in the above-described two cases is changed so that the water absorption characteristic and the fatty ink adhering characteristic are varied in proportion to the exposure energy, as a result of which the middle tone parts of the original can be printed. The method is advantageous in that it is unnecessary to use a contact screen and no moiré pattern is formed in multi-color printing. However, since the surface of the printing form is of the gelatin film, its mechanical strength is weak, and therefore it is difficult to print a number of copies with one printing plate formed in accordance with the method. In addition, it is difficult for the method to provide images which can be readily observed with the naked eye, by itself or without the printing step.

SUMMARY OF THE INVENTION

A first object of the invention is to provide an image recording material on which a continuous tone original is contact-printed or projection-printed to provide a gradational image in accordance with a principle completely different from conventional ones.

A second object of the invention is to provide an image recording material with which an image which can be readily observed with the naked eye can be provided, the image recording material recorded with an image being usable as a printing form as it is or after being subjected to simple after-treatment.

A third object of the invention is to provide an image recording material usable as a rigid printing form in which no moiré pattern is formed in multi-color printing.

A fourth object of the invention is to provide an image recording material with which the image of an original can be provided as a physical property image with gradation due to physical properties such as electrical, magnetic, thermal, interfacial, chemical and dynamic properties by a developing process or a simple after-treatment subsequent to exposure to light.

The foregoing objects and other objects of the invention will be achieved by the provision of an image recording material comprising a support, a photosensitive composition layer formed on the support, and a mono-particle layer of mixed solid particles different in optical transmittance formed on the photosensitive composition layer, the particle holding characteristic of the photosensitive composition layer being varied by exposure to light in response to the exposure energy.

The novel features which are considered characteristic of this invention are set forth in the appended claims. The invention itself, however, as well as additional objects and advantages thereof will be best understood from the following detailed description when read in conjunction with the accompanying drawing.

DETAILED DESCRIPTION OF THE INVENTION

The image recording material according to this invention is such that images are recorded and reproduced according to a principle completely different from conventional ones. First, the image recording principle using the image recording material according to the invention will be described with reference to simplified diagrams, in which a photosensitive composition which is made insoluble in solvents when exposed to light is used as one example of a photosensitive material.

Figure 1A:
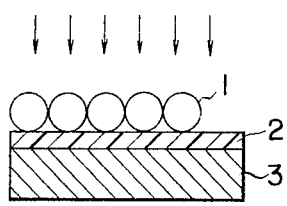
FIGS. 1A, 2A and 3A are greatly magnified sectional views showing simplified image recording materials similar to an image recording material according to this invention for a description of an image recording principle using the image recording material of the invention, FIG. 1A and 2A being reference diagrams for a description of the invention and FIG. 3A showing one example of the most simplified image recording material of the invention.
Figure 2A:
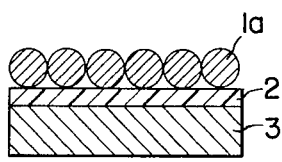
Figure 3A:
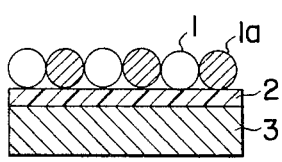

FIGS. 1A, 2A and 3A are thicknesswise cross-sectional views of image recording materials which are similar in layer arrangement to the image recording material of the invention.

In FIG. 1, the image recording material comprises: a support (or substrate) 3; a layer 2 of a photosensitive composition (such as, for instance, polyvinyl alcohol mixed with diazoresin) placed on the support 3, the photosensitive composition being made insoluble in solvents when exposed to light; and a mono-particle layer of transparent particles 1 (such as, for instance, small uncolored polystyrene balls) placed on the layer 2. Such a structure can be formed as follows. A solution of photosensitive composition is coated, in the form of a layer, on a suitable support. Then, before the layer is dried, particles 1 are blasted thereagainst so as to adhere to the layer. Thereafter, the layer is dried. The adhesive force of the photosensitive composition layer 2 causes the transparent particles 1 to be fixedly stuck to the layer 2.

Figure 1B:
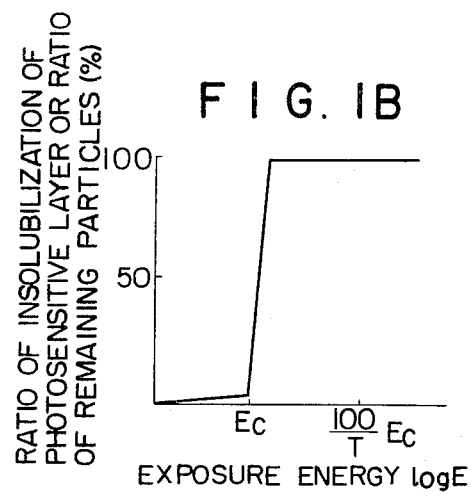
FIGS. 1B, 2B and 3B are graphical representations indicating the photosensitivity characteristic curves of the recording materials shown in FIGS. 1A, 2A and 3A, respectively.

The side of the transparent particle layer 1 of the recording material (the photosensitivity characteristic curve of which is shown in FIG. 1B) is exposed to light. Then, when the exposure energy is less than the critical exposure energy $E_C$ of the photosensitive composition, the composition is soluble in water, but if it exceeds the energy $E_C$, the photosensitive composition becomes insoluble. Therefore, if the exposed recording material is developed by applying physical removal force thereto, e.g., if it is developed by rubbing the surface of the particle layer 1 or vibrating the recording material with the surface of the particle layer 1 facing downwardly after the exposed recording material is immersed in a solvent, or water, or after the particle layer 1 is coated with water, then the particles 1 in the regions of the recording material where the exposure energy exceeds the value $E_C$ remain fixed to the composition layer 2. However, the particles 1 in the regions of the recording material where the exposure energy is less than the value $E_C$ are removed because the composition layer under the particles 1 is dissolved in the water. Accordingly, the percentage in number of particles left on the surface of the recording material is as indicated by the photosensitivity characteristic curve of the recording material in FIG. 1B.

Figure 2B:
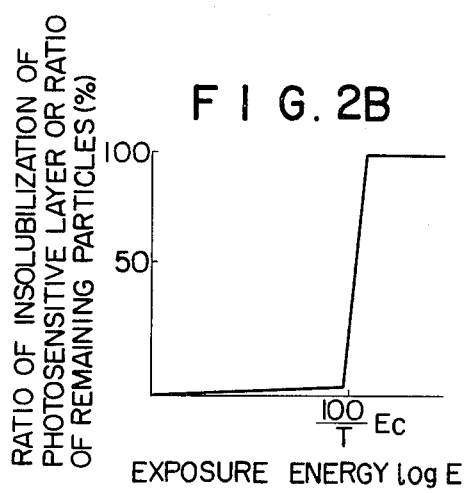

In the case where, similarly as in the above described case, the recording material shown in FIG. 2A, which is obtained by replacing the transparent particles 1 of the recording material in FIG. 1 by colored particles 1a having a transmittance T%, is used, the removal of particles depends on whether or not the quantity of exposure exceeds a value $(100/T)E_C$. The photosensitivity characteristic curve is as indicated in FIG. 2B.

Figure 3B:
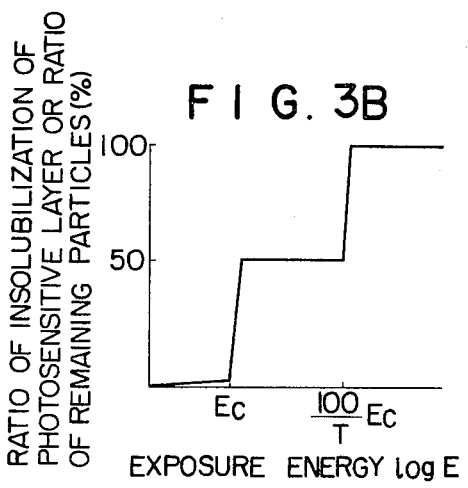

Furthermore, in the case where a recording material as shown in FIG. 3A, which is obtained by replacing the transparent particles 1 of the recording material in FIG. 1A by a mixture of the transparent particles 1 and the colored particles 1a having a transmittance T% with a mixing ratio of 50:50, is used, a photosensitivity characteristic curve as shown in FIG. 3B is obtained. That is, both of the transparent particles 1 and colored particles 1a remain in the region where the exposure energy exceeds the value $(100/T)E_C$, only the transparent particles 1 remaining in the region where the exposure energy is from the value $E_C$ to the value $(100/T)E_C$, and almost all of the particles are removed from the region where the exposure energy is less than the value $E_C$.

When a continuous tone image is printed on the recording material shown in FIG. 1A or 2A by contact with an original or projection, the image is recorded but the gradation is lost. However, if the recording material shown in FIG. 3A is used, a two-tone image can be recorded. The recording material shown in FIG. 3A is one example of the recording material according to the invention.

As is apparent from the above description, a continuous tone image can be better recorded by increasing the number of steps of different transmittances of the particles. Furthermore, the configuration of the photosensitivity characteristic curve can be changed as desired by varying the mixing ratio of particles of different transmittances. This is one of the important features of the image recording material of the invention.

The image recording material of the invention may be similar to a mosaic screen photosensitive plate for a color picture, in which three-primary-color starch or plastic particle layers are provided as a mosaic screen on the light source side of the photosensitive agent layer in that the colored particle layer is provided on the light source side of the photosensitive agent layer. However, the mosaic screen photosensitive plate is different in that, unlike the invention, it is not required to have a characteristic by which the particle holding characteristic is varied by exposure to light. Furthermore, in the mosaic screen photosensitive plate, the colored particles are essentially uniform in density and serve merely as a wavelength cut filter. The density of color is determined by the density of silver deposited in development; that is, the particles do not relate to the density of color.

In addition, the mosaic screen photosensitive plate is different from the image recording material of the invention in that, since the physical particle removal is not taken into account in exposure and development, a system is employed in which a color particle layer is disposed between the support and the photosensitive agent layer, and the plate is exposed to light through the support.

The image recording and reproducing principle using the image recording material according to the invention has been described with respect to the particular case where a particular photosensitive material is employed. However, those skilled in the art would readily understand that the image recording material of the invention can be variously modified and can be presented in more general form within the technical concept described in the claims appended.

Modifications and generalizations of the image recording material of the invention will now be described.

First, it should be noted that any material such as metal, glass, plastics, or ceramics can be used as the support if it is possible to form the photosensitive composition layer on at least one surface thereof. In order to improve the adhesion characteristic of the photosensitive composition layer, the surface of the support may be made rough by graining, for example, if necessary.

In the above-described example, a resin whose solubility in a solvent is decreased by exposure is employed as the photosensitive composition.

Examples of the photosensitive composition of this type are: (1) macromolecular or polymer materials the variations in structure and physical property of which are considerably accelerated by irradiation of relatively long wavelength ultraviolet rays or visible rays; (2) materials in which the macromolecules by themselves do not function at all in response to light applied thereto, but the properties of the macromolecules are varied by the action of the coexisting photosensitive material; and (3) materials which change from monomer to polymer by photopolymerization mechanism.

One example of the materials as defined by (1) above is polyvinyl alcohol cinnamate obtained by esterifying the hydroxyl groups of polyvinyl alcohol with cinnamic acid. When this material is irradiated with ultraviolet rays, it becomes insoluble in solvents like trichloroethylene because the cinnamoyl groups originated from the cinnamic acid photo-dimerize to cause crosslinking. Commercially available examples of the photosensitive resin of this type are KPR made by Kodak and TPR made by Tokyo Ōka Kōgyō. Polyvinyl alcohol esterified with cinnamylideneacetic acid instead of cinnamic acid also becomes insoluble through photo-dimerization. KOR distributed from Kodak is said to be a photosensitive resin which is a cinnamylidene derivative. For these photosensitive resins, spectral sensitization is possible by adding appropriate sensitizers thereto. Other molecules have been known to cause photo-dimerization and their application is possible.

One example of the materials of the type (2) is polyvinyl alcohol mixed with diazo-resin as mentioned above. In this system, the diazonium salt decomposes upon exposure to light and reacts with hydroxyl groups of polyvinyl alcohol to form ether bonds, thereby rendering the polyvinyl alcohol crosslinked and water-insoluble.

Diazide compounds also cause photodecomposition, and nitrene thus formed is active and causes several reactions such as hydrogen extraction, reaction with double bonds and coupling. Accordingly, diazide compounds are used, by their addition, for photo-insolubilization of polyacrylamide, polyacrylonitrile, cyclic rubber, styrene/butadiene copolymers, phenolic resins, and polyvinyl alcohol on which acrylamide or acrylonitrile has been grafted.

A mixture of a water-soluble macromolecular material such as gelatin or polyvinyl alcohol and a dichromate becomes water-insoluble upon exposure to light. This phenomenon has been attributed to photo-crosslinking reaction in the presence of chrome.

As an example of the materials of the type (3) above, a photosensitive composition comprising a difunctional acrylic monomer (such as diethylene glycol methacrylate or triethylene glycol dimethacrylate), a photo-initiator (such as benzoin and anthraquinone), and a polymer becomes insoluble through homopolymerization or graft-polymerization on the polymer of the monomer upon exposure to light. As examples of the polymer, alkali-soluble succinic acid ester of acetylcellulose and polyvinylpyridine are used. Under this type, a dilute acid-soluble photosensitive resin used in Dycril available from E. I. du Pont is classified. A photosensitive composition comprising a water-soluble polymer, an acrylic monomer and a photopolymerization initiator, upon exposure to light, also causes homopolymerization and grafting on the polymer of the monomer simultaneously and becomes insoluble. As the water-soluble polymer, partially saponified polyvinyl acetate (saponification degree: 80 to 85%) which can be dissolved in water, may be used. This polymer corresponds to a photosensitive resin contained in the NAPP made by Nippon Paint Co., Ltd. There are many other photosensitive compositions of this type.

The photosensitive compositions defined by (1), (2) and (3) can be classified as negative type photosensitive compositions. Accordingly, when each of the photosensitive composition is subjected to development with a solvent, the particles adhering to the regions which have not been exposed are selectively removed, as a result of which a negative image is obtained.

The photosensitive composition may also be of the positive type wherein the exposed regions are soluble is a solvent, but the non-exposed regions are not soluble in the solvent.

One example of the compositions of this type is a mixture of an alkali-soluble phenol novolak resin and a quinone diazide. The exposed regions can be dissolved and removed with an aqueous alkaline solution because the quinone diazide is changed into an alkali-soluble, carboxylic acid derivative upon exposure to light. The non-exposed regions are insoluble in an aqueous alkaline solution because a quinone diazide and a novolak resin cause coupling reaction therebetween in the presence of an alkali. Commercially available photo-resists for etching of this type are, for example, azoplates, those sold under AZ series from Shipley Co., Fuji-positive-photoresist available from Fuji Yakuhin Kōgyō and Photosol available from Tokyo Ōka Kōgyō.

The solubility in solvent of each of the photosensitive resins of the types described above is changed directly by exposure. However, photosensitive resins whose solubilities with respect to solvents are changed indirectly, i.e., by particular treatment after being exposed to light may also be used similarly. For instance, in the case of a silver halogenide gelatin emulsion layer, with the use of a specific, principal developing agent (such as a tanning developing liquid), the gelatin in the exposed regions is hardened with the result that it becomes insoluble in hot water. Therefore, when the layer is immersed in hot water after being subjected to fixing with a fixing liquid and to washing with water, the non-exposed region is dissolved therein.

The photosensitive compositions of the second type are such that liquid-to-solid phase conversion is caused therein by exposure. Examples of these photosensitive compositions are oligomers having an unsaturated group, material obtained by adding a vinyl monomer to an oligomer having an unsaturated group, and material obtained by adding a photo-initiator to the aforementioned material. For example, a composition obtained by adding a polymerizable monomer such as styrene and an initiator to an ester of an unsaturated acid such as maleic anhydride and a polyhydric alcohol such as diethylene glycol, is usually soluble in a dilute alkali solution and is cured under light. The non-exposed regions are liquid and are therefore not only removable by dissolving them with a dilute alkali aqueous solution (in this sense, this composition may be classified under the above mentioned first type) but also removable by blowing them off by air-jet or centrifugal force. Those photosensitive compositions used in APR from Asahi Kasei, Tevista from Teijin and Zonne from Kansai Paint are classified under this type.

The photosensitive compositions of the third type are such that the adhesive or sticking force, to the particles, thereof is changed by exposure.

The selective removal of particles from the photosensitive composition of this type is carried out by either of two different methods. In one of these methods, the particles are selectively removed from the photosensitive composition layer. In the other method, the photosensitive composition layer peels off the support, as a result of which the particles together with the photosensitive composition layer are removed. The latter method causes similar phenomena to those caused with the use of the photosensitive compositions of the fourth type, and therefore it will be described with reference to these photosensitive compositions.

The photosensitive compositions of the fourth type are such that the adhesion strength relative to the support is changed by exposure. With the photosensitive compositions of this type, as in the case of the latter example of the photosensitive compositions of the third type, the photosensitive composition layer in the exposed regions and that in the non-exposed regions are selectively peeled off from the support to remove the particles. Such selective peeling (i.e., development) is carried out by a method wherein, for instance, after the photosensitive composition layer is exposed to light, a sticking tape is applied to the particle layer, and then it is pulled off, and is achieved when the following sections meet the following conditions (where A–B is the adhesion strength between A and B).

Image section (where the particles remain)

Particle-photosensitive composition > sticking tape-particle and

Photosensitive composition-support > sticking tape-particle

Non-image section (from which the particles are removed)

Sticking tape-particle > photosensitive composition-support

When the above conditions are satisfied as a result of the variation in adhesion strength between the photosensitive composition layer and the support being caused by exposure, the photosensitive composition belongs to the fourth type, whereas when the conditions are satisfied as a result of the variation in adhesion strength between the photosensitive composition layer and the particles, the photosensitive composition belongs to the third type. Thus, the two are different in cause but cannot be distinguished from each other in phenomenon.

For instance, in a system wherein a photosensitive composition obtained by adding 4,4'-diazide chalcone to polyvinyl chloride is used, the support is a copper plate, and the particles are colored starch particles, development is carried out as follows. After the image recording material is exposed to light, sticking tape is applied to the particle layer, and the image recording material with the sticking tape is heated at 100° C. for a suitable period of time. Thereafter, the tape is pulled off the image recording material. In this case, the particles in the exposed regions are left on the support, while the particles in the non-exposed regions are removed with the sticking tape.

The photosensitive compositions of the fifth type are such that the cohesion force is changed by exposure, and therefore when a sticking tape applied to the particle layer is pulled off, cohesion breakage is caused with priority in the photosensitive composition layer in the exposed regions or in the non-exposed regions, as a result of which the particles are removed with the photosensitive composition being removed. The photosensitive compositions of the fifth type are similar in phenomenon to those of the third and fourth types and in the latter two types, cohesion breakage presumably occurs.

While five essential types of photosensitive compositions employed in the invention have been described, it should be noted that the invention is not limited thereto or thereby. That is, photosensitive compositions other than those of the above described five types can be employed in the invention provided that they satisfy the condition that, as described above, the particle holding characteristic is changed directly or indirectly by exposure, as a result of which the direct or indirect particle holding characteristic of the exposed regions is increased (negative type) or decreased (positive type) when compared with that of the non-exposed regions.

As is apparent from FIGS. 1B through 3B, it is preferable that a photosensitive composition usable in the invention have a relatively clear critical exposure value $E_C$ and a steep photosensitivity characteristic curve (irrespective of kinds of properties corresponding to photosensitivity and varying due to exposure), so that the resolution of the recording material is improved to obtain images high in contrast. However, it is obvious that a photosensitive composition having a moderate photosensitivity characteristic curve can be used in the invention, although such a photosensitive composition may provide relatively unclear images or soft tone images.

These photosensitive resins in solution or emulsion state are coated on the supports in accordance with a suitable method such as dip coating, bar coating, spray coating, brush coating, or screen printing to form a photosensitive resin layer thereon.

The thickness of the photosensitive composition layer is not particularly limited. However, it is necessary that, when the particle layer is formed by blasting particles before the photosensitive composition solution or emulsion coated on the support has dried, the thickness of the liquid on the support be smaller than the radius of the particles; otherwise the photosensitive composition will cover the particles, and the particles will be fixed irrespective of the density thereof. In the case where the photosensitive composition layer is in solid state or in sticky solid state, and the particle layer is fixedly secured to the photosensitive composition layer, the thickness of photosensitive composition layer is not particularly limited. However, in view of the sensitivity of the image forming material according to the invention, it is useless to increase the thickness of the photosensitive composition layer to an extent more than that required. It is desirable that the final appearance be such that the photosensitive composition layer is not over the particles, and less than the half of the volume of each particle is in the layer. In general, it is preferable that the dried film thickness be from 1 to 50 $\mu$m, especially 2 to 15 $\mu$m, although it depends on the diameter of the particles used.

Any kind of particles can be employed in the invention provided that they are transparent to a certain extent and can be colored. For instance, transparent or semitransparent plastic particles, crystalline starch particles, glass particles and wax particles can be employed in the invention. Coloring may be effected with an appropriate method selected according to the particles used such as dyeing, melt-coloring or solution coloring using an appropriate hue of dyestuff or pigment. The optical densities of the particles are controlled within a range of 0.01 to 2.5, preferably 0.3 to 1.4, by such coloring method.

The optical density of the particles can be determined as follows. For instance, in the case of a photosensitive composition which is made insoluble by exposure: a critical exposure energy necessary for it to become insoluble is determined; a particle layer having a unitary density is formed on the photosensitive composition layer by the above-described method; and an exposure energy necessary for holding the particle is determined. Then, the optical transmittance of the particles can be calculated by comparing the exposure energy with the aforementioned critical exposure energy, and the optical density can be calculated. Different kinds of particles may be mixed, as the case may be. It is necesssary to use particle materials which will not cause undesirable changes in property during the developing.

In the invention, particles colored in various densities are applied to the photosensitive composition layer in such a manner that a mono-particle layer which is dense and uniform in distribution is formed. If the mono-particle layer is not formed, then the incident light is extensively scattered between the particles, as a result of which the image of the original is made unclear, and the function of reproducing continuous tone based on the difference between the optical transmittances of the particles is lowered. The mono-particle layer can be formed as follows. For instance, while the photosensitive composition layer formed on the support is still wet, mixed particles are blasted against the layer, or the mixed particles are accumulated thereon and then excessive particles are removed therefrom, for instance, by using a spatula. If, in this connection, a large amount of photosensitive liquid remains on the support before the particles are applied thereto, a multi-particle layer is formed instead of the mono-particle layer. Therefore, in this case, the particles should be applied to the photosensitive composition layer after the latter is nearly dry. Alternatively, if the mono-particle layer is formed on a backing sheet, it can be transferred onto the photosensitive resin layer on the support by utilizing heat or pressure.

In order to form such a mono-particle layer, the particles should be relatively round, most preferably spherical. However, they may be elliptical or mixtures of spherical and elliptical particles. As the grain size of the particles is decreased, the resolution of the recording material is increased. In general, the usable grain size is from 5 to 1,000 $\mu$m, preferably 20 to 80 $\mu$m.

The particles can be colored in various hues within the range which is permitted by the spectral sensitivity of the photosensitive composition. Accordingly, in this range, multi-color images can be obtained. With regard to this point, the image recording material of the invention may be similar in characteristic to the mosaic screen photosensitive plate.

The image recording material of the invention is obtained as described above. A transparent protective resin layer may be further formed on the particle layer in order to improve the preservability of the image recording material provided that it will not obstruct the development. For instance, in the above-described example in which the material obtained by adding diazonium salt to polyvinyl alcohol is used as the photosensitive composition, a thin layer of polyvinyl alcohol may be formed on the particle layer. This protective layer is dissolved and removed in the initial stage of the development.

The image recording material is subjected to contact printing or projection printing and then to exposure in a conventional manner. In exposing the image recording material of the invention, there can be a certain distance between the original and the photosensitive layer because of the presence of the particle layer therebetween. Accordingly, for an image recording material with relatively large particles, it is preferable to use a light source which emits relatively parallel light rays in order to improve the reproducibility of images. For instance, satisfactory results can be obtained by using a printer with a honey-comb-shaped parallel filter.

If the recording materials exposed to light are developed by the methods described above in the paragraphs of the respective photosensitive compositions, images will be formed by the density, or light and shade patterns of particles left on the recording materials or by the color hues thereof.

In order to improve the preservability of the image, the protective film may be formed on the surface of the image.

Recording and forming images with the image recording material of the invention have been described by using examples or in general form. However, it should be noted that an important feature of the invention resides in that an image record plate thus obtained can be used as a printing form as it is or by subjecting it to simple after-treatment. Although the term "plate" is used, it is merely intended to mean that an image has been recorded thereon, not to define the shape and nature. Thus, the term "plate" includes sheets and films also.

If, in the above-described examples, lipophilic particles such as polystyrene particles are used as the particles, the image record plates thus obtained can be used as lithographic printing forms with the residual particles as the lipophilic parts thereof. Furthermore, negative or positive printing forms can be readily obtained from the image record plate by inversion. For instance, if the image record plate on which the lipophilic particles are left is coated with aqueous emulsion lacquer, the lacquer will be repelled by the particle-left regions, while it will adhere to the particle-removed regions. Thereafter, the lacquer is dried and the left particles are removed. Since the dried lacquer is lipophilic, a lithographic printing form can be obtained with the dry lacquer regions as the lipophilic parts.

In the application of the image record plate obtained as described above, images can be recorded as physical property images based on electrical, magnetic, thermal, chemical and dynamic properties. The above-described printing form can be considered as a physical property image due to differences in interfacial property.

Another example is an image record plate which is obtained by using the image recording material of the invention, and in which a polyester film of high heat-resistance which has been subjected to plasma treatment to improve its lipophilic characteristic is used as the support, the above-described polyvinyl alcohol-diazoresin mixture being used as the photosensitive composition layer, and polystyrene particles colored in different densities are used as the particles. In this image record plate, the support, i.e., the polyester film, and the polystyrene particles appear in the surface. If a heating plate at a uniform temperature is brought into contact with the side of the image record plate where the particles are provided, and the temperatures of various points on the opposite side, i.e., the polyester film side are measured by a certain method, the image can be detected as an image of different temperatures because polystyrene is different from polyester in heat conductivity. Furthermore, since polystyrene is different from polyester in heat softening characteristic and heat decomposition characteristic, in this case also images due to thermal properties can be obtained.

The difference in reaction with reagents and in coloring characteristic provides images due to chemical properties. In addition, the difference in viscoelasticity provides images due to dynamic properties. With an image recording material in which particles of $v$-iron oxide are stuck to polystyrene particles by heat and pressure, magnetic images due to magnetic properties, i.e., differences in magnetization, can be obtained. Utilization of the image recording material for images based on electrical properties will become clear from examples described later.

As is clear from the above description, according to the invention, a completely novel image recording material is provided which is obtained by skillfully utilizing the optical selective transmission characteristics of colored particles, and the variations in particle holding characteristic of photosensitive compositions which are caused by exposure. With this image recording material, not only visible images, but also printing forms can be readily obtained. Thus, the image recording material according to the invention has a wide range of application.

The invention will be more concretely described with respect to the following examples.

EXAMPLE 1

A photosensitive composition was prepared by mixing one part of diazoresin into 100 parts of an 8.5% aqueous solution of polyvinyl alcohol (GH-7 produced by Nippon Gōseikagaku Kōgyō Co.). The photosensitive composition thus prepared was coated on a clean, grained aluminum plate to form a dry film about 2 μm in thickness. Before the liquid was dried, mixed, colored polystyrene particles were blasted against the aluminum plate to form a mono-uniform particle layer thereon. After the liquid was dried, a negative continuous tone original was placed in close contact with the image recording material thus obtained, and then the image recording material with the original was subjected to printing by a printer with an ultraviolet light source. The image recording material was dried after being developed with flowing water.

Thereafter, in order to stabilize the image, the image recording material was passed through rolls which were heated at 180° C., to allow the polystyrene particles to firmly stick to the aluminum plate. The image recording material thus treated was employed as a printing form in an offset printing machine, Type 326, manufactured by A. B. Dick Co., as a result of which satisfactory printed matter was obtained.

In this example, the diameter of the polystyrene particles was about 40 to 70 μm. Eight kinds of polystyrene particles of respectively different optical densities in the range of from 0.3 to 1.4 were mixed in equal ratio. More specifically, the particles were prepared as follows. First, a 20% solution in benzene of polystyrene was colored in various densities with an oil soluble dye (oil black) and was then emulsified in a 1% aqueous solution of polyvinyl alcohol (GH23 produced by Nippon Gōseikagaku Kōgyō Co). Thereafter, the liquid was heated to evaporate off the benzene. Thus, the particles were prepared.

EXAMPLE 2

A glass plate was coated relatively thickly and uniformly with a photosensitive resin OSR-P produced by Tokyo Ōka Kōgyō Co. (the thickness of the film being 5 μm when dried). Three kinds of small glass balls (44 to 88 μm in diameter) colored blue in different densities were mixed in equal mixing ratio. The glass balls were gently sprinkled on the photosensitive liquid before it was dried to form a uniform mono-layer of glass balls thereon. After the image recording material thus formed was dried, the small ball layer was exposed through a negative continuous tone original by using an ultraviolet printer with a honey-comb-shaped filter.

The image recording material thus exposed was developed by using trichloroethylene. Then, the image recording material was dried. A mixture of 100 parts of Epicoat 815 produced by Shell Kagaku Co. and six parts of a hardener, i.e., triethylenetetramine was prepared. After bubbles were removed from the mixture, the mixture was caused to flow over the particle layer on the glass plate. The recording material was heated at about 80° C. for a short period of time to remove bubbles formed between the particles. The recording material was left standing so as to harden the mixture. As a result, an image was obtained which could be observed by means of transmission light or reflection light.

EXAMPLE 3

A photosensitive composition was prepared by mixing one part of diazoresin into 100 parts of polyvinyl alcohol (GH-17, produced by Nippon Gōseikagaku Kōgyō Co.). The photosensitive composition was uniformly applied to a clean, grained aluminum plate to form a film thereon (the thickness of the dried film being about 2 μm). Colored polystyrene particles similar to those in Example 1 were blasted against the film before it was dried, to form a mono-particle layer. After the film was dried, a positive continuous tone original was placed in close contact with the image recording material thus obtained. Then, the image recording material with the original was subjected to printing by using a printer with an ultraviolet light source.

A liquid was prepared by mixing 10 parts of polyvinyl acetate emulsion produced by Nippon Carbide Kōgyō Co., 1 part of pigment and 100 parts of water. An appropriate amount of the liquid thus prepared was sprayed onto the image recording material by using an air compress after the recording material was washed with water. The emulsion liquid was repelled by the polystyrene and therefore adhered to the regions other than the regions where the polystyrene was left. After the solution was dried, a vinyl acetate resin film was formed. The printing form was immersed in water and the surface thereof was rubbed with a soft brush. As a result, the polystyrene particles were removed, and an image formed by the vinyl acetate resin film was obtained. This printing form can be employed for the offset printing machine, Type 326, manufactured by A. B. Dick Co.

EXAMPLE 4

The image recording material of the invention can provide a relatively satisfactory image even if its support is not completely flat. A photosensitive resin KOR produced by Kodak Co. was applied to a white tile by wheeler coating. Before the liquid was dried, a mixture of potato starch particles colored blue in various densities was blasted against the liquid to form a uniform mono-particle layer.

The image of a negative continuous tone original was enlarged and printed on the image recording material by using an enlarger S-690 manufactured by Fuji Shashin Film Co. The image recording material was subjected to development by using a developer, and thereafter the resultant image was fixed by spraying with acrylic lacquer.

EXAMPLE 5

A photosensitive liquid obtained by adding 15 g of ammonium dichromate to 1 l of 8% aqueous solution of partially saponified polyvinyl alcohol (molecular weight:500), was applied to a stainless steel plate to form a thin coat thereon. Before the photosensitive liquid was dried, glass balls of 100 μm in diameter and colored blue in various densities were sprinkled onto the thin coat and were fixed. After the photosensitive liquid was dried, the image recording material thus formed was exposed through a negative continuous tone original.

Thereafter, the recording material was subjected to development with running water. After being dried, the recording material was uniformly heated in an electric oven. As a result, the glass balls were fused and joined to the stainless steel plate, and a part of the polyvinyl alcohol was carbonized. By using a burner, the carbonized polyvinyl alcohol was completely burned, while the glass balls were fixedly secured to the stainless steel plate. The temperature of the recording material thus treated was increased to 1200° C., and was then gradually decreased in the electric oven. As a result, an image was formed by the molten glass balls on the stainless steel plate.

EXAMPLE 6

A photosensitive resin KOR produced by Kodak Co. was applied to a glass plate. A mixture of potato starch particles colored blue in various densities and potato starch particles colored yellow in various densities was blasted against the photosensitive liquid before the latter was dried.

The image recording material thus formed was exposed through a negative continuous tone original and a filter which cut off wavelengths shorter than 450 mμ. Thereafter, the recording material was further exposed through another negative continous tone original and a combination of filters which passes wavelengths of from about 400 mμ to about 450 mμ. The recording material thus treated was subjected to development by using a developer. As a result, different colored images in two hues were obtained.

EXAMPLE 7

A support was prepared by depositing aluminum by vacuum evaporation to a thickness of about 2 μm on a polyester film 150 μm in thickness. A photosensitive composition solution prepared by mixing 1 part of diazoresin into 100 parts of polyvinyl alcohol (GH-17 produced by Nippon Gōseikagaku Kōgyo Cō.) was applied to the support with a Mire's bar No. 18. Particles obtained by coloring polystyrene with oil black in various densities were blasted against the photosensitive liquid before the latter was dried. The photosensitive liquid was dried to obtain an image recording material.

A negative continuous tone original was printed on the recording material by using a printer with an ultraviolet ray source. The recording material was then subjected to developing with running water, and thereafter dried. The recording material was passed through rolls heated at 180° C. so that the polystyrene particles were firmly secured to the support. The recording material thus treated was charged by a corona charger, as a result of which only the polystyrene particles were charged, but the aluminum surface was not charged because it was grounded. Static toner particles used in plain paper copying (PPC) were sprinkled on the recording material, and the excessive toner particles were removed by shaking the recording material. Heat and pressure were applied through a sheet to the recording material, whereupon the toner particles were transferred to the sheet, and an image of rich gradation was obtained.

What is claimed is:

1. An image recording material comprising:
a support;
a first layer of photosensitive composition formed on said support; and
a single uniform and dense layer of solid particles having at least two different optical transmittances formed on said first layer, said photosensitive composition having a particle holding characteristic which is varied by exposure to light, said particles having an average grain size of from 5 to 100 μm and an optical density of 0.01 to 2.5 and not overlying each other.

2. An image recording material as claimed in claim 1, in which the solubility with respect to a solvent of said photosensitive composition is varied by exposure to light, whereby said particle holding characteristic is varied.

3. An image recording material as claimed in claim 1, in which the phase of said photosensitive composition is changed from a liquid phase to a solid phase by exposure to light, whereby said particle holding characteristic is varied.

4. An image recording material as claimed in claim 1, in which said photosensitive composition has a particle adhesion characteristic which is varied by exposure to light, whereby said particle holding characteristic is varied.

5. An image recording material as claimed in claim 1, in which said photosensitive composition has a characteristic of adhering to said support which is varied by exposure to light, whereby said particle holding characteristic is varied.

6. An image recording material as claimed in claim 1, in which the thickness of said first layer is from 1 to 500 μm.

7. An image recording material as claimed in claim 1, in which said solid particles are different in color hue.

8. An image recording material as claimed in claim 1, in which said solid particles are spherical, elliptical or mixtures of spherical and elliptical particles.

9. An image recording material as claimed in claim 1, in which said solid particles are transparent or semi-transparent particles selected from the group consisting of plastic particles, crystalline starch particles, glass particles, wax particles and mixtures thereof.

10. An image recording method comprising: exposing to light an image recording material as claimed in claim 1 and subjecting the exposed image recording material thus exposed to development so that said solid particles are left on said image recording material responsively according to exposure energies of light to which the photosensitive composition is exposed.

11. A printing form produced by exposing to light an image recording material as claimed in claim 1, and then subjecting the image recording material thus exposed to development so that said solid particles are left on said image recording material responsively according to exposure energies of light to which the photosensitive composition is exposed.

* * * * *